(12) United States Patent
Sonderegger

(10) Patent No.: US 11,079,417 B2
(45) Date of Patent: Aug. 3, 2021

(54) DETECTION OF ELECTRIC POWER DIVERSION

(71) Applicant: Itron, Inc, Liberty Lake, WA (US)

(72) Inventor: Robert Sonderegger, Oakland, CA (US)

(73) Assignee: Itron, Inc., Liberty Lake, WA (US)

( * ) Notice: Subject to any disclaimer, the term of this patent is extended or adjusted under 35 U.S.C. 154(b) by 807 days.

(21) Appl. No.: 14/302,617

(22) Filed: Jun. 12, 2014

(65) Prior Publication Data
US 2015/0241488 A1    Aug. 27, 2015

Related U.S. Application Data

(60) Provisional application No. 61/944,558, filed on Feb. 25, 2014.

(51) Int. Cl.
G01R 22/06    (2006.01)
G06Q 50/06    (2012.01)

(52) U.S. Cl.
CPC ........... G01R 22/066 (2013.01); G06Q 50/06 (2013.01)

(58) Field of Classification Search
CPC ....... G01R 22/066; G01R 27/08; G06Q 50/06
See application file for complete search history.

(56) References Cited

U.S. PATENT DOCUMENTS

| 4,146,841 A | 3/1979 | McRae |
| 4,532,471 A * | 7/1985 | Hurley ................. G01R 22/066 324/110 |
| 4,930,064 A | 5/1990 | Tanaka et al. |
| 5,184,119 A * | 2/1993 | Stanbury ............ G01R 21/1336 324/110 |
| 5,617,329 A | 4/1997 | Allison et al. |
| 5,831,423 A | 11/1998 | Mancini |
| 5,920,720 A | 7/1999 | Toutonghi et al. |
| 6,334,050 B1 | 12/2001 | Skarby |

(Continued)

FOREIGN PATENT DOCUMENTS

DE    102008044915    3/2010
DE    102013106393    12/2013

(Continued)

OTHER PUBLICATIONS

Tom A Short "Advanced Metering for Phase Identification, Transformer Identification, and Secondary Modeling", Jun. 6, 2013, IEEE, vol. 4 No. 2, pp. 651-658.*

(Continued)

*Primary Examiner* — Manuel A Rivera Vargas
*Assistant Examiner* — Yaritza H Perez Bermudez
(74) *Attorney, Agent, or Firm* — Lee & Hayes, P.C.

(57) ABSTRACT

Techniques for detecting electrical meter bypass theft are described herein. In one example, a time-series of voltage-changes and current-changes associated with electrical consumption measured at a meter are obtained. The time series may track associated voltage and current changes at short intervals (e.g., 5-minutes). The voltage and current changes may indicate a slight voltage change when an appliance is turned on or off. An analysis (e.g., a regression analysis) may be performed on the voltage-changes against the current-changes. Using the correlation from the analysis, it may be determined if the meter was bypassed.

19 Claims, 10 Drawing Sheets

(56) References Cited

U.S. PATENT DOCUMENTS

| | | | |
|---|---|---|---|
| 6,456,097 B1 | 9/2002 | Sutherland | |
| 7,272,518 B2 | 9/2007 | Bickel et al. | |
| 7,523,185 B1 | 4/2009 | Ng et al. | |
| 7,583,197 B2 | 9/2009 | Wesby Van Swaay | |
| 7,936,163 B2* | 5/2011 | Lee, Jr. ............... | G01R 22/066 324/110 |
| 8,094,010 B2 | 1/2012 | Wesby-van Swaay | |
| 8,283,911 B1 | 10/2012 | Bierer | |
| 8,301,386 B1 | 10/2012 | Redmond et al. | |
| 8,407,016 B2 | 3/2013 | Slota et al. | |
| 8,639,391 B1 | 1/2014 | Alberth, Jr. et al. | |
| 8,797,018 B2 | 8/2014 | Watkins et al. | |
| 9,031,800 B2 | 5/2015 | Filippenko et al. | |
| 9,230,429 B2 | 1/2016 | McKinley et al. | |
| 9,924,242 B2 | 3/2018 | Van Wyk | |
| 2005/0063317 A1 | 3/2005 | Risberg et al. | |
| 2005/0177646 A1 | 8/2005 | Kawano et al. | |
| 2006/0071776 A1 | 4/2006 | White, II et al. | |
| 2006/0167981 A1 | 7/2006 | Bansod et al. | |
| 2007/0005277 A1 | 1/2007 | Bickel et al. | |
| 2007/0247331 A1* | 10/2007 | Angelis ................. | G01D 4/006 340/870.02 |
| 2008/0089390 A1 | 4/2008 | Picard | |
| 2009/0045976 A1 | 2/2009 | Zoldi et al. | |
| 2009/0058088 A1* | 3/2009 | Pitchford ............. | G01F 15/063 290/50 |
| 2009/0276170 A1 | 11/2009 | Bickel | |
| 2009/0299660 A1 | 12/2009 | Winter | |
| 2010/0002348 A1 | 1/2010 | Donolo et al. | |
| 2010/0007336 A1* | 1/2010 | de Buda ................. | H04B 3/54 324/127 |
| 2010/0060259 A1 | 3/2010 | Vaswani et al. | |
| 2010/0088431 A1 | 4/2010 | Oshins et al. | |
| 2010/0134089 A1 | 6/2010 | Uram et al. | |
| 2010/0142447 A1 | 6/2010 | Schlicht et al. | |
| 2010/0179704 A1* | 7/2010 | Ozog ................. | H02J 13/0006 700/291 |
| 2011/0116387 A1 | 5/2011 | Beeco et al. | |
| 2011/0122798 A1 | 5/2011 | Hughes et al. | |
| 2011/0126176 A1 | 5/2011 | Kandasamy et al. | |
| 2011/0215945 A1 | 9/2011 | Peleg et al. | |
| 2011/0254525 A1 | 10/2011 | Gaknoki et al. | |
| 2012/0041696 A1 | 2/2012 | Sanderford, Jr. et al. | |
| 2012/0062210 A1* | 3/2012 | Veillette ............... | H04Q 9/00 324/110 |
| 2012/0117392 A1 | 5/2012 | Turicchi, Jr. et al. | |
| 2012/0126636 A1 | 5/2012 | Atsumi | |
| 2012/0169300 A1 | 7/2012 | Rouaud et al. | |
| 2012/0181974 A1 | 7/2012 | Kuniyosi et al. | |
| 2012/0198037 A1 | 8/2012 | Shelby et al. | |
| 2012/0201195 A1 | 8/2012 | Rausch et al. | |
| 2012/0229089 A1 | 9/2012 | Bemmel et al. | |
| 2013/0024149 A1 | 1/2013 | Nayar et al. | |
| 2013/0035885 A1 | 2/2013 | Sharon et al. | |
| 2013/0076534 A1 | 3/2013 | Conant et al. | |
| 2013/0101003 A1 | 4/2013 | Vedantham et al. | |
| 2013/0110425 A1 | 5/2013 | Sharma et al. | |
| 2013/0241746 A1 | 9/2013 | McKinley et al. | |
| 2013/0242867 A1 | 9/2013 | Bell | |
| 2013/0275736 A1 | 10/2013 | Kelley et al. | |
| 2013/0278437 A1 | 10/2013 | Wyk | |
| 2013/0335062 A1 | 12/2013 | de Buda et al. | |
| 2014/0005964 A1 | 1/2014 | Rouaud et al. | |
| 2014/0012524 A1 | 1/2014 | Flammer, III | |
| 2014/0032506 A1* | 1/2014 | Hoey ................... | G06F 16/215 707/691 |
| 2014/0039818 A1 | 2/2014 | Arya et al. | |
| 2014/0049109 A1 | 2/2014 | Kearns et al. | |
| 2014/0074670 A1* | 3/2014 | Garrity ................. | G06Q 40/12 705/30 |
| 2014/0161114 A1 | 6/2014 | Shuey | |
| 2014/0173600 A1 | 6/2014 | Ramakrishnan Nair | |
| 2014/0214218 A1* | 7/2014 | Eldridge ................. | H02H 7/22 700/286 |
| 2014/0236506 A1* | 8/2014 | Nikovski ............. | G01R 22/066 702/61 |
| 2014/0330955 A1 | 11/2014 | Bishop et al. | |
| 2014/0337429 A1 | 11/2014 | Asenjo et al. | |
| 2014/0358839 A1* | 12/2014 | Dhurandhar ........... | G06N 20/00 706/48 |
| 2014/0368189 A1* | 12/2014 | Bernheim ............. | G01R 22/066 324/115 |
| 2014/0379303 A1* | 12/2014 | Chandrashekaraiah ...................... | G06Q 50/06 702/189 |
| 2015/0052088 A1 | 2/2015 | Arya et al. | |
| 2015/0103672 A1 | 4/2015 | Stuart | |
| 2015/0200713 A1 | 7/2015 | Hui et al. | |
| 2015/0241482 A1* | 8/2015 | Sonderegger ........ | G06Q 50/06 702/65 |
| 2015/0253367 A1 | 9/2015 | Flammer, III et al. | |
| 2015/0280782 A1 | 10/2015 | Airbinger et al. | |
| 2015/0377949 A1 | 12/2015 | Ramirez | |
| 2016/0109491 A1 | 4/2016 | Kann | |
| 2016/0109497 A1 | 4/2016 | Aiello et al. | |
| 2016/0142514 A1 | 5/2016 | Stuber et al. | |
| 2016/0154040 A1 | 6/2016 | Driscoll et al. | |
| 2016/0173237 A1 | 6/2016 | Braun et al. | |
| 2016/0352103 A1 | 12/2016 | Aiello et al. | |
| 2017/0168098 A1 | 6/2017 | Aiello et al. | |
| 2018/0156851 A1 | 6/2018 | Driscoll et al. | |
| 2018/0213304 A1 | 7/2018 | Van Wyk | |

FOREIGN PATENT DOCUMENTS

| | | |
|---|---|---|
| EP | 1460801 | 9/2004 |
| GB | 2426596 | 11/2006 |
| JP | 06273200 | 9/1994 |
| JP | 2000175358 | 6/2000 |
| JP | 2000249730 | 9/2000 |
| JP | 2004340767 | 12/2004 |
| JP | 2012016270 | 1/2012 |
| JP | 2012058233 | 3/2012 |
| JP | 2012521596 | 9/2012 |
| JP | 2014079138 | 5/2014 |
| JP | 2015076994 | 4/2015 |
| JP | 2015107012 | 6/2015 |
| WO | WO2007063180 | 6/2007 |
| WO | WO2009061291 | 5/2009 |
| WO | WO2010105038 | 9/2010 |
| WO | WO2010110787 | 9/2010 |
| WO | WO2014124318 | 8/2014 |

OTHER PUBLICATIONS

Tom A Short "Advanced Metering for Phase Identification, Transformer Identification, and Secondary Modeling", Jun. 6, 2013, IEEE, vol. 4 No. 2, pp. 651-658 (Year: 2013).*

Hughes, "Augmenting AMI to Radically Reduce Electricity Theft", Metering International, Issue 1, Jan. 1, 2011, pp. 80-83, retrieved from the internet on May 20, 2015 at http://www.metering.com/wp-content/uploads/2013/10/MI-1-2-11.pdf.

Final Office Action for U.S. Appl. No. 13/560,078, dated Jul. 1, 2015, Hartman Van Wyk, "Automatic Network Topology Detection and Fraud Detection", 23 pages.

The PCT Search Report and Written Opinion dated May 22, 2015 for PCT application No. PCT/US2015/017571, 9 pages.

The PCT Search Report and Written Opinion dated Jun. 1, 2015 for PCT Application No. PCT/US2015/017575.

Short, "Advanced Metering for Phase Identification, Transformer Identification, and Secondary Modeling", IEEE Transactions on Smart Grid, IEEE, USA, vol. 4, No. 2, Jun. 1, 2013, pp. 651-658.

Office action for U.S. Appl. No. 13/560,078, dated Oct. 2, 2015, Van Wyk, "Automatic Network Topology Detection and Fraud Detection", 29 pages.

PCT Search Report and Written Opinion dated Oct. 20, 2015 for PCT Application No. PCT/US15/44191, 11 pages.

Do, et al., "Open-Source Testing Tools for Smart Grid Communication Network", 2013 IEEE Conference on Open Systems (ICOS), Dec. 2, 2013, pp. 156-161, retrieved on Feb. 7, 2014.

(56) References Cited

OTHER PUBLICATIONS

"Health Device Profile", Medical Devices WG, Internet citation, Jun. 26, 2008, pp. 1-44, retrieved from the internet on Nov. 9, 2015 at URL:https://www.bluetooth.org/docman/handlers/DownloadDoc.ashx?doc_id=260864&vld=290095&_ga=1.128761092.961309788.1447059724.
Madden, et al., "TinyDB: An Acquisitional Query Processing System for Sensor Networks", ACM Transactions on Database Systems, vol. 30, No. 1, Mar. 1, 2005, pp. 122-173.
Maqousi, et al., "Towards an Open Architecture for Smart Grid Communications: Possible Pointers from Multiservice Network Research", 2013 1st International Conference & Exhibition on the Applications of Information Technology to Renewable Energy Processes and Systems, IEEE, May 29, 2013, pp. 114-118, retrieved on Aug. 29, 2013.
Office action for U.S. Appl. No. 14/280,286, dated Feb. 16, 2016, Sonderegger, "Smart Grid Topology Estimator", 19 pages.
"Open Smart Grid Protocol (OSGP); draft ETSI GS OSG 001", European Telecommunications Standards Institute (ETSI), France, vol. zArchive—ISG, No. VO.1.2, Nov. 15, 2011, pp. 1-250, retrieved on Nov. 15, 2011.
The PCT Search Report and Written Opinion dated Jan. 28, 2016 for PCT application No. PCT/US2015/056482, 10 pages.
The PCT Search Report and Written Opinion dated Feb. 18, 2016 for PCT application No. PCT/US20165/063512, 13 page.
The PCT Search Report and Written Opinion dated Mar. 2, 2016 for PCT application No. PCT/US2015/061390, 15 pages.
Moritz et al., "A CoAP based SOAP Transport Binding", IEEE Conference on Emerging Technologies and Factory Automation (ETFA'2011), Sep. 2011, 4 pages.
Office action for U.S. Appl. No. 14/547,561, dated Jul. 29, 2016, Stuber, "Application Platform Operable on Network Node", 33 pages.
Final Office Action for U.S. Appl. No. 14/280,286, dated Aug. 4, 2016, Robert Sonderegger, "Smart Grid Topology Estimator ", 20 pages.
The PCT Search Report and Written Opinion dated Jul. 7, 2016 for PCT application No. PCT/US2016/030144, 12 pages.
Regehr et al.,"TinyOS 2.1 Adding Threads and Memory Protection to TinyOS", proceedings of the 6th ACM conference on Embedding Network Sensor Systems (SenSys'08), Apr. 2008, 2 pages.
Snell, "Call SOAP Web services with Ajax Part 1: Build the Web services client", IBM Corporation developerWorks, Oct. 2005, 13 pages.
Handley, et al., "ComEd Corrects Meter-Transformer Mismatches" ComEd Paper, Sep. 7, 2016, 8 pages.
The Australian Office Action dated Mar. 17, 2017 for Australian Patent Application No. 2015223145, a counterpart foreign application of U.S. Appl. No. 14/280,286, 4 pages.
Berthier et al., "Intrusion detection for advanced metering infrastructures: Requirements and architectural directions", In Smart Grid Communications (SmartGridComm), 2010 First IEEE International Conference on Oct. 4, 2010, pp. 350-355.
Final Office action for U.S. Appl. No. 13/560,078, dated Feb. 24, 2017, Hartman et al., "Automatic Network Topology Detection and Fraud Detection", 33 pages.
Office action for U.S. Appl. No. 14/280,286, dated Mar. 17, 2017, Sonderegger, "Smart Grid Topology Estimator", 13 pages.
The Canadian Office Action dated Oct. 26, 2016 for Canadian patent applicatoin No. 2863596, a counterpart foreign application of U.S. Appl. No. 13/560,078, 3 pages.
Office action for U.S. Appl. No. 13/560,078, dated Feb. 24, 2017, Van Wyk, "Automatic Network Topology Detection and Fraud Detection", 32 pages.
Office action for U.S. Appl. No. 14/558,571, dated Mar. 9, 2017, Driscoll, "Electrical Network Topology Determination", 15 pages.
Office Action for U.S. Appl. No. 14/518,564, dated Jul. 20, 2017, Kann, "Grid Topology Mapping With Voltage Data", 18 pages.

The Australian Office Action dated Aug. 23, 2017 for Australian Patent Application No. 2015223053, a counterpart foreign application of U.S. Appl. No. 14/302,617, 10 pages.
The Japanese Office Action dated Aug. 29, 2017 for Japanese Patent Application No. 2016-553886, a counterpart foreign application of U.S. Appl. No. 14/302,617.
The Japanese Office Action dated Sep. 12, 2017 for Japanese patent application No. 2016-553860, a counterpart foreign application of U.S. Appl. No. 14/280,286.
Keisuke Sugiura, Mitsubishi Electric Research Laboratories, Information Processing Society of Japan, 2013, pp. 4-513-4-514.
Office action for U.S. Appl. No. 14/280,286, dated Aug. 11, 2017, Sonderegger, "Smart Grid Topology Estimator", 15 pages.
Office Action for U.S. Appl. No. 13/560,078, dated Feb. 13, 2015, Hartman Van Wyk, "Automatic Network Topology Detection and Fraud Detection", 22 pages.
Translated coyp of the Japanese Office Action dated Oct. 28, 2014 for Japanese patent application No. 2014-511377, a counterpart foreign application of U.S. Appl. No. 13/560,078, 5 pages.
Final Office Action for U.S. Appl. No. 13/560,078, dated Oct. 6, 2014, Hartman Van Wyk, "Automatic Network Topology Detection and Fraud Detection", 34 pages.
Sharon, et al., Topology Identification in Distribution Network with Limited Measurements, Inovative Smart Grid Technology Conference, Jan 16-20, 2012, IEEE, pp. 1-6.
The Extended European Search Report dated Sep. 6, 2012 for European patent application No. 12165026.1, 6 pages.
Translated Japanese Office Action dated Apr. 22, 2014 for Japanese patent application No. 2014-511377, a counterpart foreign application of U.S. Appl. No. 13/560,078, 6 pages.
Office action for U.S. Appl. No. 13/560,078, dated Dec. 16, 2013, Van Wyk, "Automatic Network Topology Detection and Fraud Detection", 23 pages.
Office action for U.S. Appl. No. 13/560,078 , dated Aug. 15, 2013, Van Wyk, "Automatic Network Topology Detection and Fraud Detection", 16 pages.
The PCT Search Report dated Jan. 31, 2013 for PCT application No. PCT/US12/34697, 9 pages.
Australian Examination Report dated Apr. 28, 2016, for Australian Patent Application No. 2012377368, a counterpart application of U.S. Appl. No. 13/560,078,3 pages.
The Australian Office Action dated Jan. 10, 2018 for Australian patent application No. 2015349942, a counterpart foreign application of U.S. Appl. No. 9,781,231, 3 pages.
The Australian Office Action dated Jan. 5, 2018 for Australian Patent Application No. 2017202822, a counterpart foreign application of U.S. Appl. No. 13/560,078, 3 pages.
The Australian Office Action dated Feb. 26, 2018 for Australian Patent Application No. 2015223145, a counterpart foreign application of U.S. Appl. No. 14/280,286, 3 pages.
The Australian Office Action dated Feb. 6, 2018 for Australian patent application No. 2015337110, a counterpart foreign application of U.S. Appl. No. 14/518,564, 3 pages.
The Canadian Office Action dated Feb. 26, 2018 for Canadian patent application No. 2965101, a counterpart foreign application of U.S. Appl. No. 14/518,564, 3 pages.
Communication pursuant to Article 94(3) EPC dated Jul. 29, 2016, for EP Application No. 12165026.1, a counterpart application of U.S. Appl. No. 13/560,078, 6 pages.
Office action for U.S. Appl. No. 14/280,286, dated Feb. 1, 2018, Sonderegger, "Smart Grid Topology Estimator", 20 pages.
Office Action for U.S. Appl. No. 15/058,112, dated Mar. 29, 2018, Aiello, "Automatic Network Device Electrical Phase Identification", 14 pages.
The Australian Office Action dated May 17, 2018 for Australian Patent Application No. 2017202822, a counterpart foreign application of U.S. Appl. No. No. 13/560,078, 2 pages.
The Canadian Office Action dated Apr. 9, 2018 for Canadian patent application No. 2969685, a counterpart foreign application of U.S. Pat. No. 9,835,662, 4 pages.
The Japanese Office Action dated Apr. 24, 2018 for Japanese Patent Application No. 2016-553860, a counterpart foreign application of U.S. Appl. No. 14/280,286.

(56) References Cited

OTHER PUBLICATIONS

The Japanese Office Action dated Apr. 3, 2018 for Japanese Patent Application No. 2016-553886, a counterpart foreign application of U.S. Appl. No. 14/302,617.
Office Action for U.S. Appl. No. 15/431,473, dated May 14, 2018, Aiello, "Electrical Phase Identification", 7 pages.
The Australian Office Action dated Jun. 15, 2018 for Australian Patent Application No. 2016266732, a counterpart foreign application of U.S. Appl. No. 15/058,112, 3 pages.
The Australian Office Action dated Oct. 25, 2018 for Australian Patent Application No. 2017202822, a counterpart foreign application of U.S. Pat. No. 9,924,242, 5 pages.
The Canadian Office Action dated Oct. 2, 2018, for Canadian patent Application No. 2987580, a counterpart foreign patent application of the U.S. Appl. No. 15/058,112, 9 pages.
The European Office Action dated Sep. 17, 2018, for European Patent Application No. 15710639.4, a counterpart foreign application of U.S. Appl. No. 14/302,617, 10 pages.
Office Action for U.S. Appl. No. 15/925,651, dated Oct. 2, 2018, Van Wyk, "Automatic Network Topology Detection and Fraud Detection," 24 pages.
Office action for U.S. Appl. No. 14/280,286, dated Sep. 11, 2018, Sonderegger, "Smart Grid Topology Estimator," 21 pages.
The Australian Office Action dated Feb. 12, 2019 for Australian Patent Application No. 2018201911, a counter part of U.S. Appl. No. 14/280,286, 3 pages.
The European Office Action dated Jan. 3, 2019 for Eurpoean Patent Application No. 15802317.6, a counterpart foreign application of the U.S. Pat. No. 9,781,231, 5 pages.
The European Office Action dated Dec. 4, 2018 for European Patent Application No. 15710638.6, a counterpart of U.S. Appl. No. 14/280,286, 6 pages.
The European Office Action dated Feb. 21, 2019 for European Patent Application No. 16722992.1, a counterpart of U.S. Appl. No. 15/058,112, 5 pages.
The Japanese Office Action dated Feb. 12, 2019 for Japanese Patent Application No. 2016-553886, a counterpart of U.S. Appl. No. 14/302,617, 1 page.
Office action for U.S. Appl. No. 14/280,286, dated Feb. 14, 219, Sonderegger, "Smart Grid Topology Estimator", 16 pages.
The Japanese Reconsideration Report dated Jul. 30, 2019 for Japanese Patent Application No. 2016-007750, a counterpart of U.S. Appl. No. 14/302,617, 4 pages.
The Australian Office Action dated Jan. 9, 2020 for Australian Patent Application No. 2019200073, a counterpart of U.S. Pat. No. 9,924,242, 5 pages.
The Summons to Attend Oral Proceedings dated Sep. 10, 2019, for European Patent Application No. 15710638.6, 32 page.
The European Office Action dated Aug. 16, 2019 for European Patent Application No. 16722992.1, a counterpart of U.S. Pat. No. 10,312,681, 6 pages.
The Japanese Office Action dated Mar. 31, 2020 for Japanese Patent Application No. 2016-553886 , a counterpart of U.S. Appl. No. 14/302,617, 5 pages.
The Australian Office Action dated Jul. 21, 2020 for Australian Patent Application No. 2019200073, a counterpart of U.S. Pat. No. 9,924,242, 5 pages.
English Translation of the Japanese Office Action dated Aug. 4, 2020 for Japanese Patent Application No. 2016-553886, a counterpart foreign application of the U.S. Appl. No. 14/302,617, 2 pages.
The Japanese Office Action dated Aug. 4, 2020 for Japanese Patent Application No. 2016-553886, a counterpart foreign application of the U.S. Appl. No. 14/302,617, 2 pages.
The European Summons to Attend Oral Proceedings dated Feb. 26, 2020 for European Patent Application No. 15710639.4, a counterpart of U.S. Appl. No. 14/302,617, 2 pages.
Canadian Office Action dated Feb. 10, 2021 for Canadian patent Application No. 2936008, a counterpart foreign patent application of the U.S. Appl. No. 14/302,617, 4 pages.
Office Action for U.S. Appl. No. 14/302,617; dated Nov. 13, 2020, Sonderegger, "Detection of Electric Power Diversion", 24 Pages.
Canadian Office Action dated Mar. 23, 2021 for Canadian Patent Application No. 2936006, a counterpart foreign application of U.S. Pat. No. 10,571,493, 4 pages.

\* cited by examiner

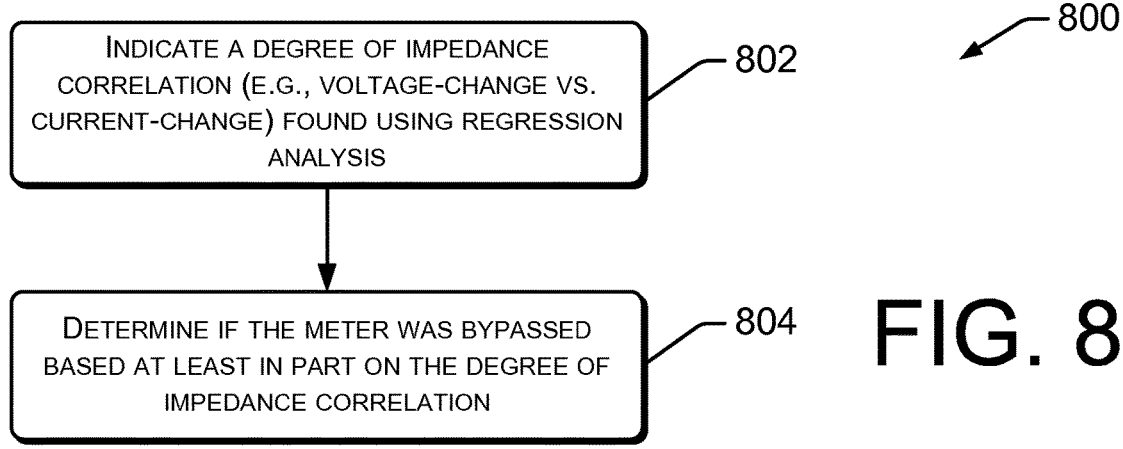
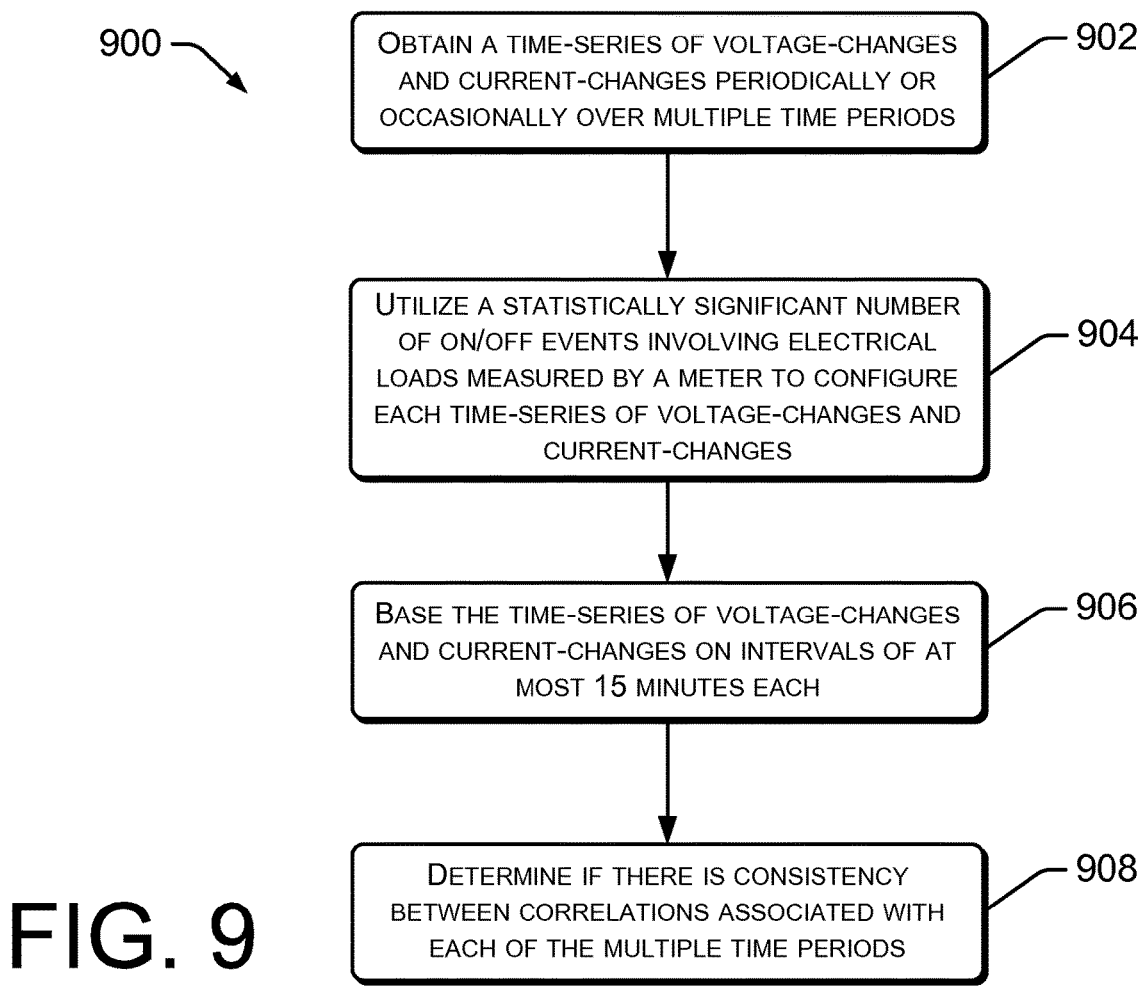

DETECTION OF ELECTRIC POWER DIVERSION

RELATED APPLICATIONS

This patent application claims priority to provisional U.S. patent application Ser. No. 61/944,558, titled "Detection of Electric Power Diversion", filed on Feb. 25, 2014, commonly assigned herewith, and hereby incorporated by reference.

BACKGROUND

Electric power diversion (e.g., theft) is a problem for the electrical power-generation and delivery industry. While techniques, such as looking at current consumption data of a customer vs. prior consumption data of the customer, may provide some insight, they aren't able to detect certain types of theft. Thus, further new technologies would be welcome.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts and examples, and not to indicate required and/or necessary elements.

FIG. 8 is a flow diagram showing an example by which impedance correlation techniques may be utilized.

FIG. 9 is a flow diagram showing an example by which regression or correlation techniques may be applied to periodically or occasionally-gathered data.

DETAILED DESCRIPTION

Overview

Figure 1:
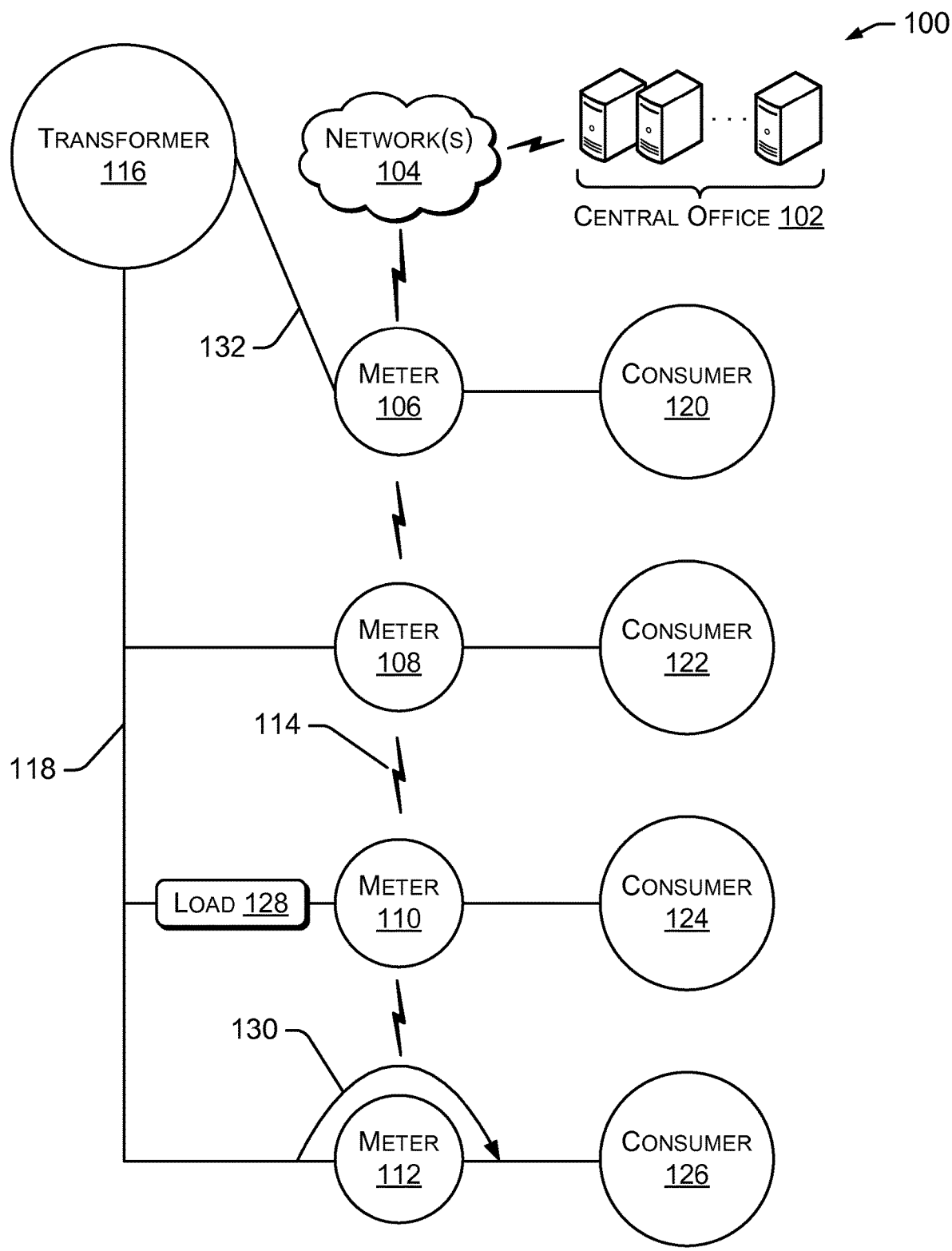
FIG. 1 is a block diagram showing an example system, including a secondary distribution transformer, henceforth simply referred to as "transformer," and a number of associated customer meters, henceforth simply referred to as "meters." In the example, the meters are networked for communication purposes using mesh techniques. Two customers have bypassed their respective meters, to thereby steal electricity. One customer has diverted electrical power around the meter. Another customer has installed a load between a meter and the transformer.

FIG. 1 is a block diagram showing an example system 100 having meters configured to indicate power diversion by a customer. The power diversion may be a meter bypass, examples of which may include wiring installed by a consumer to route electricity around the meter or a load placed between the customer's meter and the transformer. A central office 102 may utilize one or more networks 104 (e.g., public or private networks, the Internet, cellular communication, etc.) to communicate with a plurality of meters 106-112 (e.g., electric meters to measure consumer consumption of electricity). The meters 106-112 may communicate using radio frequency (RF) or power line communications (PLC) signals 114 or cellular communication. The meters 106-112 may be organized for communication into a mesh network (shown), a star network, or other configuration. A transformer 116 may provide electrical power by means of shared wiring 118, or individual wiring 132, to a plurality of customers 120-126. The meters 106-112 measure consumption of the power by the customers and create corresponding consumption data. The data is provided to the central office 102 through the network over one or more communication channels.

In the example shown, consumer 124 has bypassed the meter by installing an external load 128 between meter 110 and the transformer 116. The load 128 may allow consumer 124 to utilize significant electrical current that is not measured by the meter 110. Accordingly, the meter 110 will measure only a fraction of the power that is used by the consumer 124.

Consumer 126 has bypassed the meter by installing a bypass 130 around meter 112. The bypass 130 may allow significant electrical current to bypass the meter 112. Accordingly, the meter 112 will measure only a fraction of the power that is delivered to consumer 126. The fraction depends at least in part on the relative impedances of the bypass 130 and the meter 112.

Figure 2:
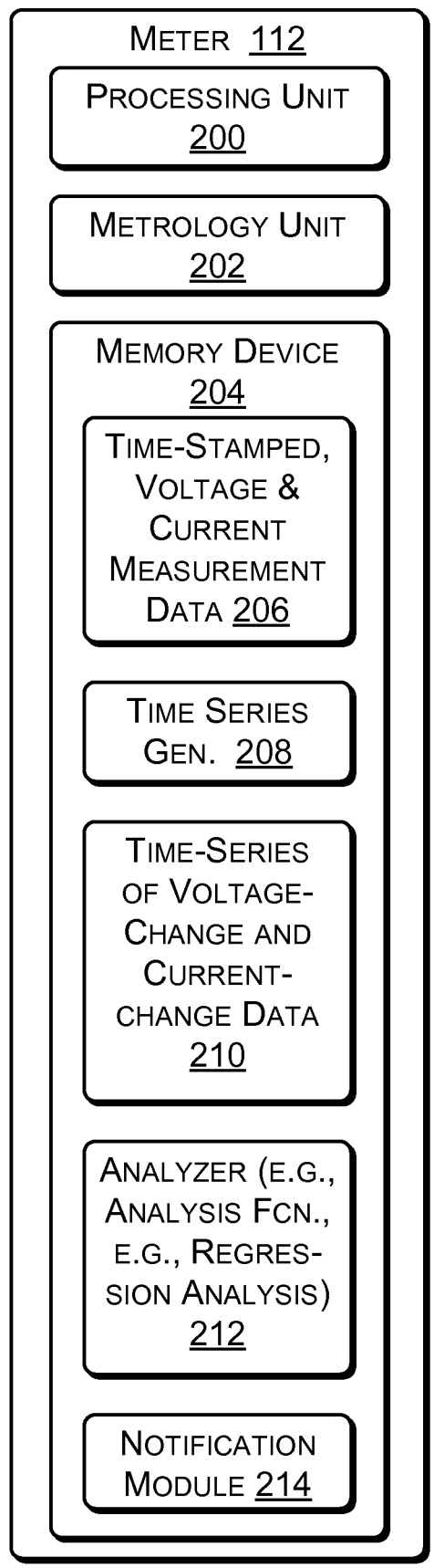
FIG. 2 is a block diagram showing a first example of a system to detect electrical power diversion. In the example, a meter is configured to perform the detection.
Figure 3:
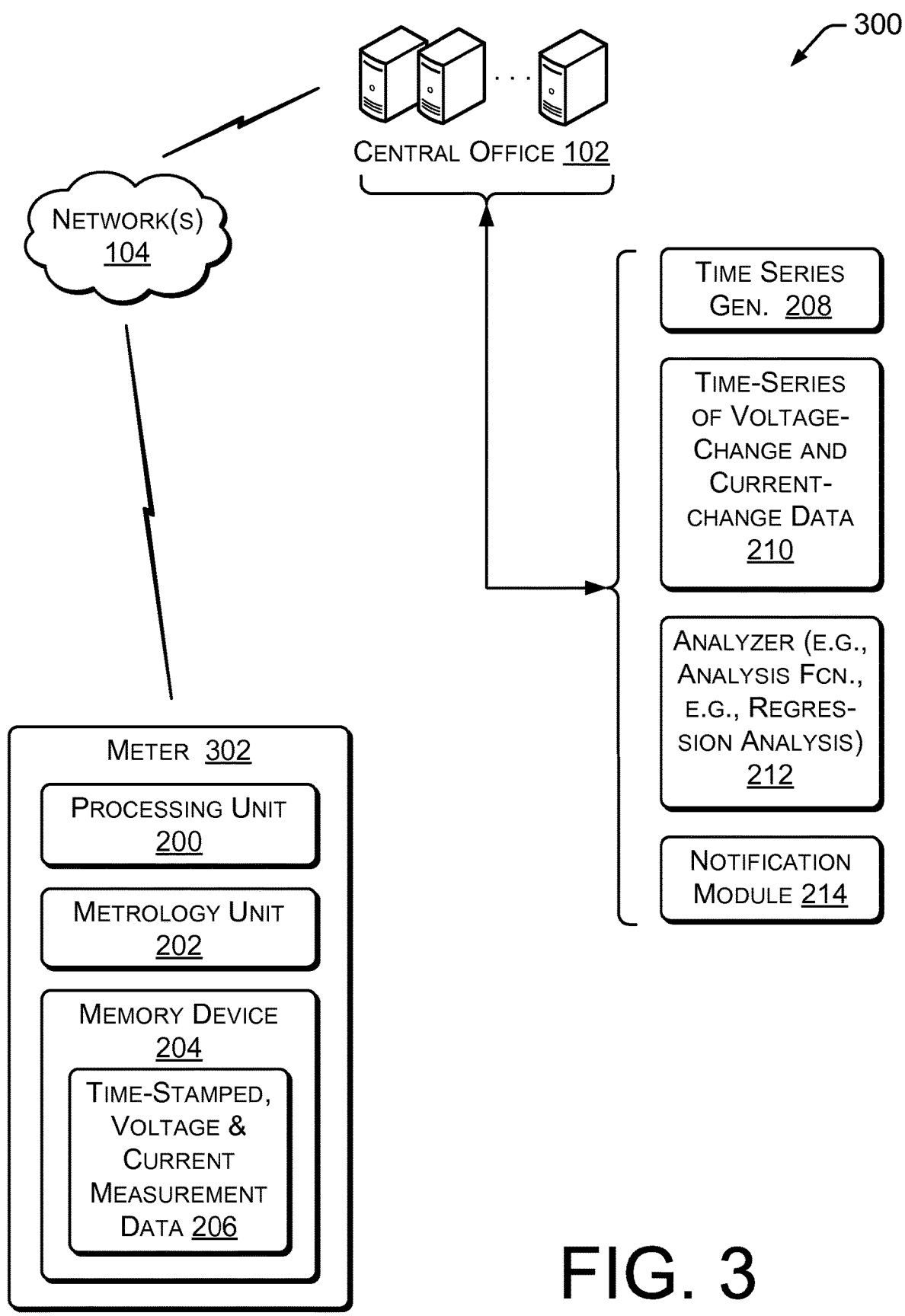
FIG. 3 is a block diagram showing a second example of a system to detect electrical power diversion. In the example, a meter and a central office are configured to perform the detection.

FIGS. 2 and 3 are block diagrams showing example structure and techniques that provide notification in the event of the installation and/or operation of an electrical diversion. FIG. 2 shows example structure and techniques located in a meter, while FIG. 3 shows example structure and techniques distributed between a meter and a central office. Other systems may be configured using the technology described herein, and may distribute the structure and techniques between one or more of a meter, a router, a transformer, an office computing facility, any computing device, etc.

FIG. 2 is a block diagram showing example functional modules and techniques within electrical consumption-measuring meter 112 that provide notification in the event of the installation and/or operation of an electrical bypass or other electrical diversion. A processing unit 200 is in communication with a metrology unit 202 and a memory device 204. The metrology unit 202 is configured to make voltage, current and/or power measurements. Such measurements may result in the time-stamped voltage and current measurement data 206 within the memory device 204.

A time-series function, or time-series generator, 208 may be configured using software, a hardware device or other technology. In operation, time-series function 208 may input the time-stamped voltage and current measurement data 206 and create a time-series of voltage-changes and current-changes 210 within the memory device 204. Thus, while the time-stamped voltage and current measurement data 206 involves measurement of voltage and current, in this example, the time-series of voltage-changes and current-changes 210 includes "change data," rather than absolute "measurement" data.

An analysis function, or analyzer, 212 may be configured using software, a hardware device or other technology. In operation, the analysis function 212 may utilize statistical techniques, such as regression analysis, least squares regression techniques, etc. In one example, the analysis function 212 performs a regression analysis (e.g., least squares regression) on the voltage-changes against the current-changes of the time-series. The result may indicate a degree of correlation between the voltage-changes and the current-changes. In one example, the analysis shows a correlation of the impedance of the time-series. The degree of correlation may be used to indicate whether a meter was bypassed during the voltage and current measurements.

A notification module 214 may be configured using software, a hardware device or other technology. In operation, the notification module 214 may configure packets, signals or other communication means to transmit data concerning the time-stamped voltage and current measurement data, the time-series of voltage-changes and current-changes, the results of the regression analysis, correlation data or other results or other information to a desired location, such as the central office 102.

FIG. 3 is a block diagram showing a system 300 that may provide notification in the event of the installation and/or operation of an electrical bypass or other electrical diversion. In system 300, example data, functional modules and techniques are distributed between a meter 302 and the central office 102. The meter 302 may be configured to include the processing unit 200, the metrology unit 202, the memory device 204 and the time-stamped voltage and current measurements 206. These elements may be configured as described with respect to FIG. 2. However, in the example system 300, the time-series function 208, the time-series of voltage-change and current-change data 210, the analysis function 212, and the notification module 214 may be configured at the central office 102, or other location, as desired.

Figure 4:
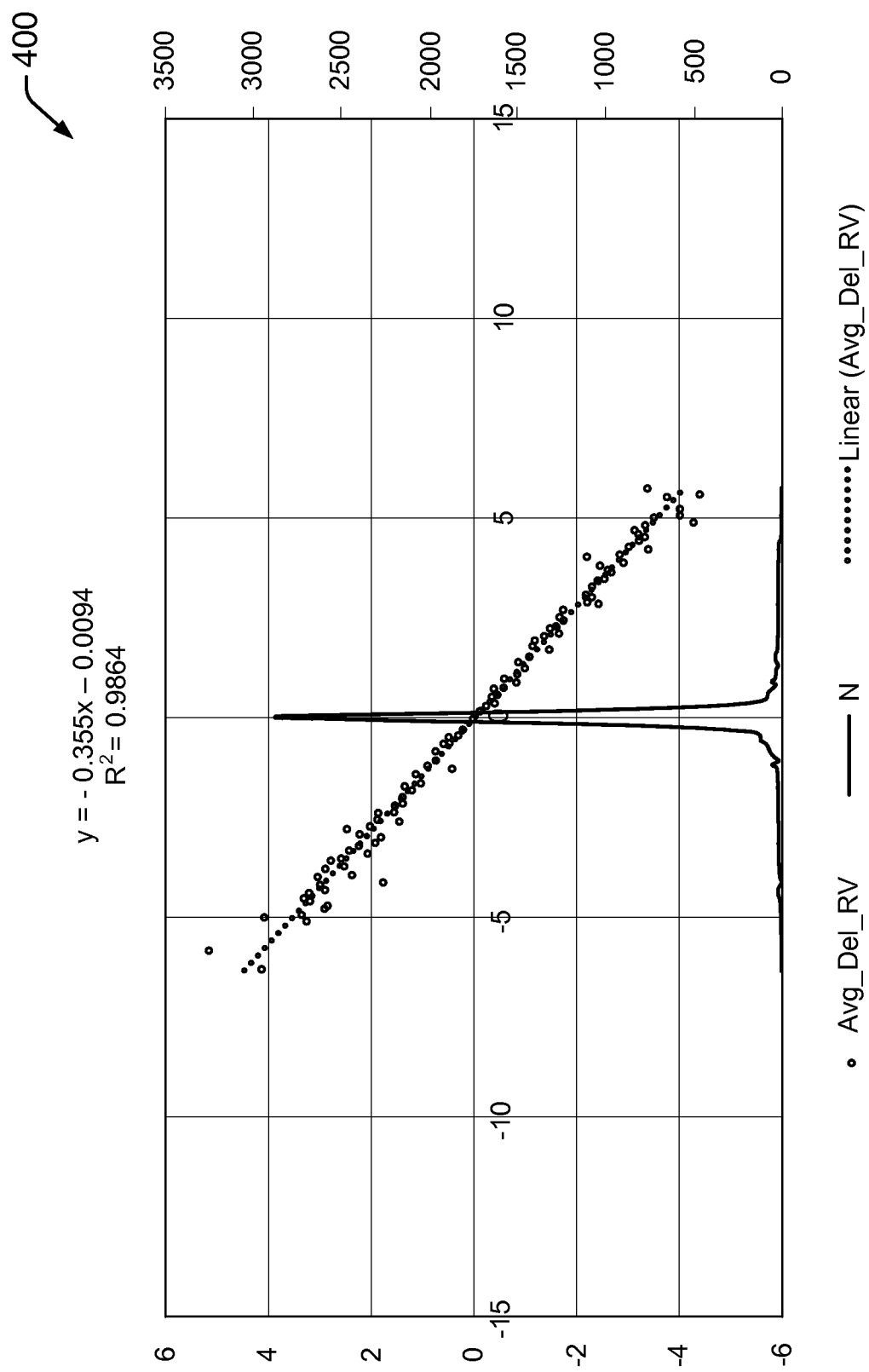
FIG. 4 is a graph showing a first example of regression techniques applied to voltage-changes against current-changes. The graph shows high impedance correlation.
Figure 5:
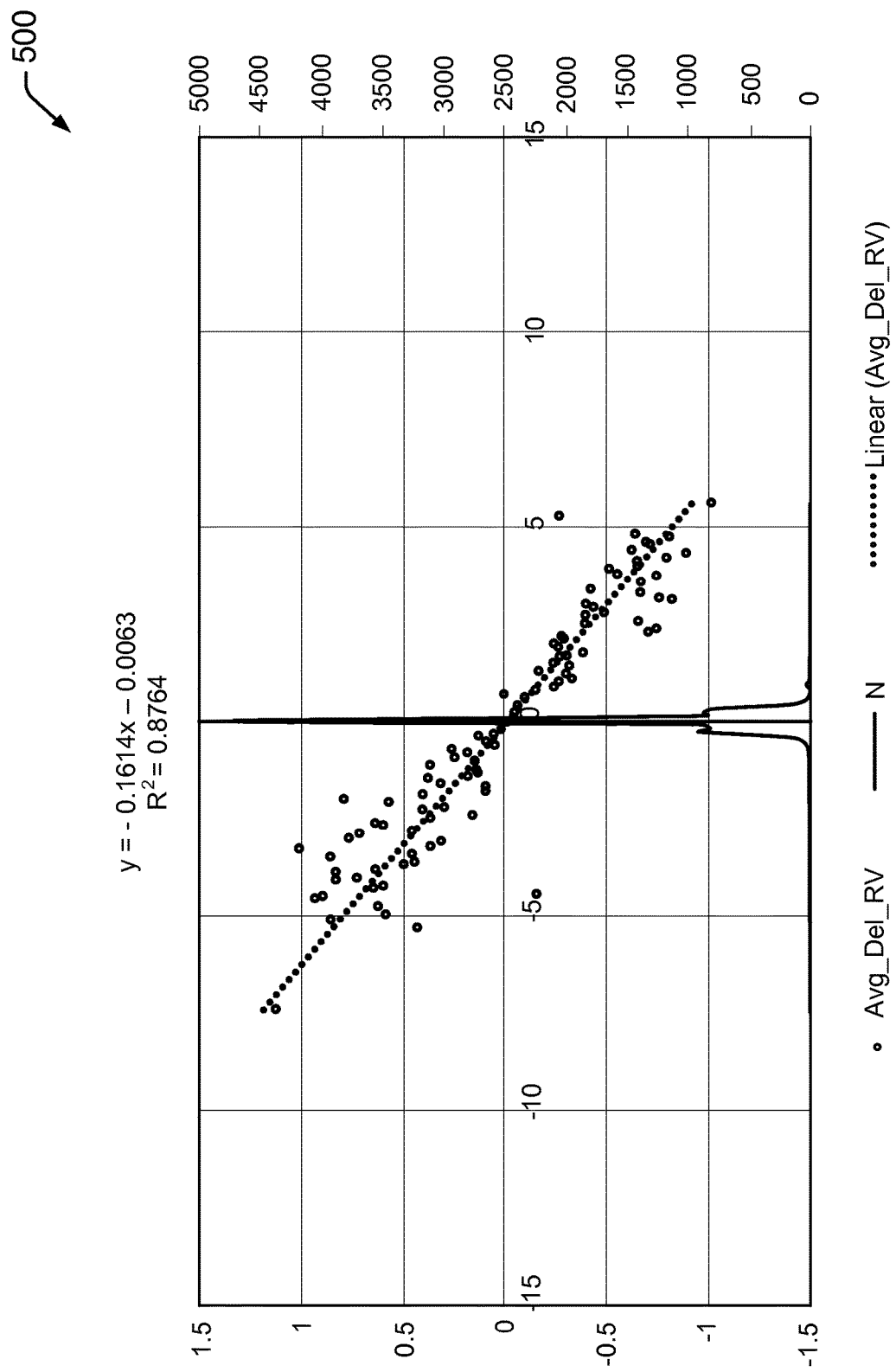
FIG. 5 is a graph showing a second example of regression techniques applied to voltage-changes against current-changes. The graph shows reasonable impedance correlation.
Figure 6:
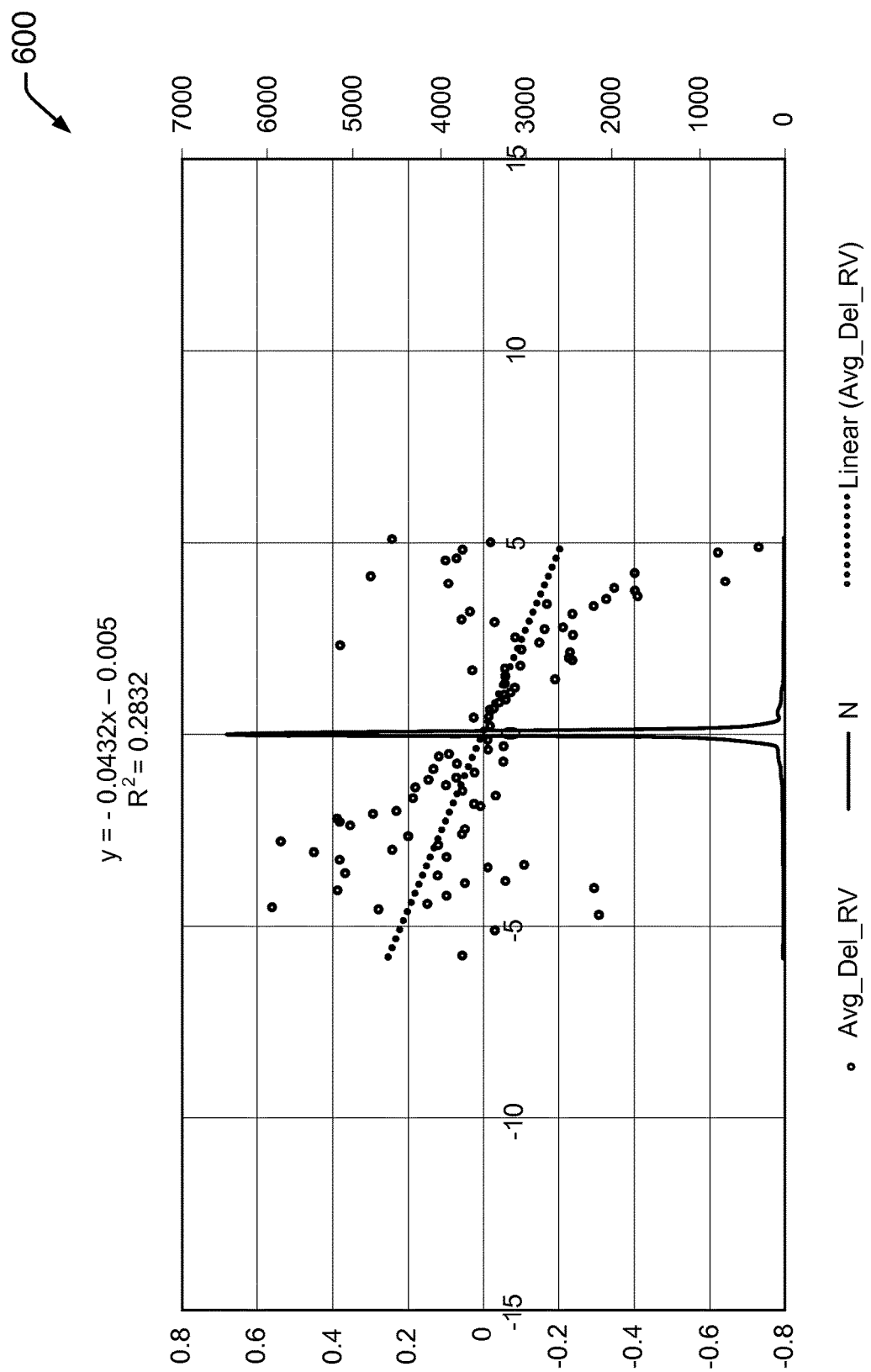
FIG. 6 is a graph showing a third example of regression techniques applied to voltage-changes against current-changes. The graph shows low impedance correlation and that impedance is indeterminate.

FIGS. 4-6 show graphed output of regression techniques applied to three different examples of input, respectively. The example input may include time-series of voltage-changes and current-changes from three different meters or time-series taken from one or more meters at different times.

FIG. 4 is a graph 400 showing a first example of regression techniques applied to voltage-changes against current-changes. The graph shows high impedance correlation, as indicated by a high $R^2$ value. Excellent impedance correlation may indicate that changes in load (e.g., a customer turning on or off an appliance) are generally associated with corresponding changes in voltage. For example, if an electric water heater or other load turns on (or off), there is a corresponding short-term dip (or spike) in voltage level.

FIG. 5 is a graph 500 showing a second example of regression techniques applied to voltage-changes against current-changes. The graph shows reasonable impedance correlation (as indicated by the $R^2$ value), suggesting that a bypass or other power diversion is probably not present.

FIG. 6 is a graph 600 showing a third example of regression techniques applied to voltage-changes against current-changes. The graph shows low impedance correlation and that impedance is indeterminate. In this example, a bypass or other diversion may be present. In one example of why correlation may be poor if a bypass is present, changes in load may not be measured (due to all or part of the load traveling through the bypass and not through the meter), but a short-term change in voltage may result due to the actual (as opposed to measured) change in the load. Thus, while a large load change may not be fully measured, it may cause a voltage change, and the measured part of the large load change will poorly correlate with that voltage change, thereby indicating diversion. Repeated instances of such poor correlation are seen in FIG. 6.

Example System and Techniques

The advent of smart meters has improved data collection and analysis as well as reduced or eliminated the need for human meter readers. Unfortunately, reduced human interaction and surveillance with meters has increased the incidence of power theft. While smart meters have a number of on-board sensors that can detect tampering with the meter itself, some forms of power theft (e.g., bypass theft when someone installs a cable that bypasses the meter or installs a load upstream of the meter), are difficult to detect with sensors installed on the meter.

The techniques described herein address the problem using a method to measure, in periodic, random or ongoing measurements, the impedance of the electrical connection (i.e., the electrical pathway) from distribution transformer to meter. For the most common case of a meter attached to the distribution transformer though an individual wire, the impedance is given by the following equation:

$$V_0 - V = Z \cdot I$$

Where:
$V_0$ is the voltage at the distribution transformer;
V is the voltage at the meter;
I is the current through the wire(s) (2 wires in a standard split-phase connection); and
Z is the impedance of the wire(s), in practice nearly identical to the electrical resistance thereof.

A normal range of such impedance is typically fractions of an Ohm, and for any single meter, it will remain approximately constant over time. Bypassing a meter will appear as an increase in the impedance ranging from significant to dramatic, depending on the amount of power diverted. Both the timing, as well as the magnitude, of power theft can be easily calculated from such a change. However, the measurement and continuous monitoring of such impedance is difficult.

In example techniques, a system of equations, such as shown above, may fully describe the electrical circuit formed by all meters attached to a secondary distribution transformer. Within the circuit, some meters may be attached individually (e.g., individual connection 132 between transformer 116 and meter 106 of FIG. 1), and others attached by shared connections (e.g., connection 118). Using these example techniques, the impedances of the various connections are unknown but can be statistically estimated by solving the same system of equations for a large number of time stamps spanning one or more days. Using the estimates, a "best fit" may be found for all unknown impedances. This approach is complex in part because it requires precise knowledge of the identity and connection type of all meters on one distribution transformer.

Other example techniques may provide even more powerful tools. In one example, factors that make the voltage measured by the meter (typically 240 volts+/−12 volts) fluctuate over the course of a day may be considered. Such factors may include: (1) overall load on the distribution network (voltage will sag during high-load conditions); (2) starting or stopping of a large load measured by one or more neighbor meters on the same transformer, resulting in a slight voltage sag or increase, respectively; (3) automatic voltage support at the distribution transformer itself (e.g., "tap changer"); and/or (4) starting or stopping of a load measured by the meter itself, resulting in an immediate voltage drop or rise.

The first three factors above all act on the voltage at the transformer tap, $V_0$. While the voltage at the meter itself, V, is accurately measured as often as the power through the meter, the unknown voltage fluctuations at the transformer, $V_0 \pm \Delta V_0$, prevent any meaningful calculation of the impedance, Z, shown in the equation shown earlier.

In one example of techniques to be discussed further, changes in voltage and current over short time intervals are analyzed. The time intervals may be 15 minutes or less, and particularly may be 5 minutes or less. Greater time intervals may be used, but frequently to less advantage. For any one interval in time indicated with a suffix, t, the original equation can be rewritten thus:

$$\Delta V_t = \Delta V_{0,t} - Z \cdot \Delta I_t.$$

If the time interval chosen is sufficiently short, the change in transformer voltage, $\Delta V_{0,t}$, can be neglected or, at a minimum, be expected to be positive as often as negative over a large number of intervals. Meanwhile, the change in current through the meter, $\Delta I_t$, will be zero much of the time. Such an assumption is reasonable because light bulbs or appliances on at the beginning of the short interval will likely still be on at the end of the short interval. Accordingly, the change in voltage at the meter, $\Delta V_t$, will also be zero most of the time. The change in voltage will be non-zero only when either $\Delta V_{0,t}$ is non-zero or when $\Delta I_t$ is non-zero, for example when an electrical load (e.g., an appliance or lights, etc.) turns on or off.

In one example, the techniques discussed herein comprise analyzing simultaneous time-series of voltage-change and current-change at a meter over typically one day or longer. An analysis (e.g., a regression, such as least squares) may be performed on the voltage changes against current changes. The resulting correlation may be useful if a statistically sufficient number, and a sufficient variety, of "on/off" events occurred (e.g., enough light bulb on/off events and at least some larger appliance on/off events) within a threshold period of time. In the examples shown, the slope term of the regression may be negative and indicates an estimate of the electrical impedance, Z.

By repeating the same approach on multiple days, the derived impedance will likely be consistent, if bypass theft is not present. However, a sudden change in impedance, especially if a dramatic increase, is indicative of a newly installed bypass. Poor convergence of the regression, indicated by a low $R^2$ in the regression analysis, may be indicative of a bypass utilized only part of the day. If the techniques discussed herein are applied at different times of day, a bypass may be better identified and quantified.

One advantage of these techniques is that the required data may be easily obtained by an electrical meter configured to do so.

Minimization of the resulting glut of data can be achieved in several ways, including: (1) limit uploading of short-interval data to occasional daily "bursts"; (2) modify meter software/firmware to automatically transmit additional data when an on/off event is detected, thus adding only modest amounts of knowledge-rich data; and/or (3) develop an application resident on the meter itself that does the regression on an ongoing basis and transmits only the relevant results (e.g., impedance and $R^2$) to the meter head end or central office.

Example Methods

In some examples of the techniques discusses herein, the methods of operation may be performed by one or more application specific integrated circuits (ASIC) or may be performed by a general purpose processor utilizing software defined in computer readable media. In the examples and techniques discussed herein, the memory 204 may comprise computer-readable media and may take the form of volatile memory, such as random access memory (RAM) and/or non-volatile memory, such as read only memory (ROM) or flash RAM. Computer-readable media devices include volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

As defined herein, computer-readable media does not include transitory media, such as modulated data signals and carrier waves, and/or signals.

Figure 7:
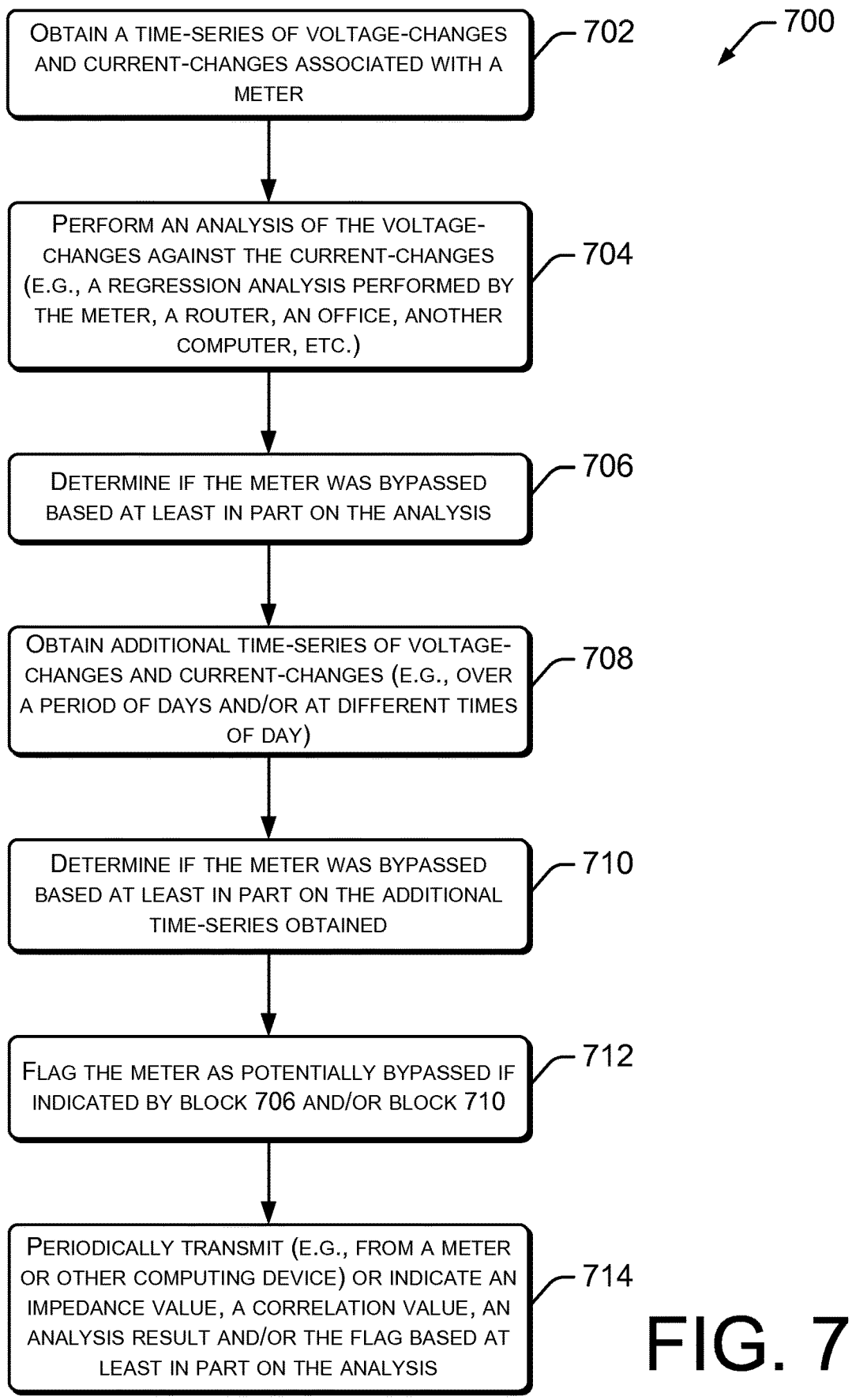
FIG. 7 is a flow diagram showing an example by which regression techniques may be applied to a time-series of voltage-changes and current-changes.

FIG. 7 is a flow diagram 700 showing an example by which regression analysis may be applied to a time-series of voltage-changes and current-changes. In one example of the techniques shown, an analysis (e.g., regression analysis) of a time-series of voltage-changes and current-changes may determine a correlation between load-changes and voltage-changes, thereby indicating likelihood that a meter associated with the time-series has been bypassed. In a second example, regression analysis of additionally obtained time-series may be utilized, which may indicate intermittent bypass of the meter.

Thus, blocks 702-706 include techniques for determining if a meter was bypassed using a single time-series obtained entirely while a bypass either was or was not installed. Blocks 708-710 include techniques for determining if a meter was bypassed using multiple time-series. The multiple time-series may include one or more obtained while a bypass was installed and one or more obtained while a bypass was not installed.

At block 702, a time-series of voltage-changes and current-changes associated with a meter is obtained. In the context of the example of FIG. 2, the metrology unit 202 may create time-stamped voltage and current measurement data 206. A time-series function 208 may use the data 206 to create the time-series of voltage-change and current-change data 210. Thus, the change data 210 may be created using time-stamped measurement data 206 obtained by the meter.

At block 704, an analysis of the voltage-changes against the current-changes of the time-series may be performed. The analysis may be a regression analysis, which may be performed by a meter, a router, a central office and/or a computing device at any location. The examples of FIGS. 2 and 3 show two examples of locations wherein calculations may be performed; however, other locations may alternatively be utilized.

At block 706, whether the meter was bypassed may be determined. In one example, the determination may be based at least in part on the analysis performed at block 704. The results of the analysis include a degree of correlation between the voltage-changes and current-changes and may be used to indicate the likelihood of a bypass installation.

If the results of the analysis are similar to the example of FIG. 4, and the results of the regression analysis techniques applied to voltage-changes against current-changes indicate high impedance correlation, it may be assumed that no bypass is installed.

If the results of the analysis are similar to the example of FIG. 5, and the results of the regression analysis techniques applied to voltage-changes against current-changes indicate reasonable impedance correlation, it may be assumed that the meter has not been bypassed, although further consideration may be indicated. One additional factor that may be considered is a number of meters on the transformer; a larger number of meters, and an associated larger number of load changes, may explain some discrepancies in the impedance correlation of a particular meter.

If the results of the analysis are similar to the example of FIG. 6, and the results of the regression analysis techniques applied to voltage-changes against current-changes indicate poor impedance correlation and that impedance is indeterminate, it may be assumed that the meter has been bypassed.

Whether a meter has been bypassed may change during different hours of the day, or different days of the month. In part to avoid detection, a customer may install bypass a meter to reduce the cost of particular electrical loads, but not others. Accordingly, at block 708, additional time-series of voltage-changes and current-changes may be obtained. The additional series may be obtained over a period of days and/or at different times of day. By obtaining time-series of voltage-changes and current-changes at different times of the day and different days of the month, it may be possible to consider the impedance correlation at times when the meter is bypassed and when it is not.

At block 710, a determination may be made if the meter was bypassed, based at least in part on the additional time-series obtained. In one example, consistency or inconsistency of impedance correlations associated with different time-series may indicate if a meter was bypassed when some time-series were created but not when others were created. The determination may be based on calculated correlations between different time-series that differ by a statistically significant amount.

At block 712, the meter may be flagged, listed or reported, etc., as potentially bypassed if indicated by the determination of blocks 706 and/or 710.

At block 714, an impedance value, a correlation value, an analysis result(s) and/or a flag may be periodically or occasionally transmitted by, or indicated by, the meter or other computing device to the central office 102 or other device. In the context of the example of FIG. 1, one or more of meters 106-112 may transmit an impedance value, correlation value or analysis result to the central office 102.

FIG. 8 is a flow diagram showing example techniques 800 by which impedance correlation techniques may be utilized. In one example, each voltage-change and current-change in a time-series indicates an impedance value. A regression analysis applied to the time-series of volt-changes and current-changes determines a degree of correlation of the impedance values. The degree of correlation may be used to determine if it is likely that a meter has been bypassed.

At block 802, a degree of impedance correlation (e.g., voltage-change vs. current-change) found using regression analysis is indicated. In the example of FIGS. 4 through 6, the $R^2$ value indicates the correlation.

At block 804, whether the meter was bypassed may be determined, based at least in part on the degree of impedance correlation. Returning to the example of FIGS. 4 through 6, the $R^2$ value may be used as an indicated of a bypass. In particular, the value of $R^2$ of any individual meter may be compared to the $R^2$ value of other meters on the same transformer. Alternatively, the impedance of any individual meter may be compared to the impedance measured at earlier times on the same meter. Or the $R^2$ of any individual meter may be compared to the same quantity derived at different times for the same meter. When any one, or more than one, of these comparisons show marked inconsistencies, the presence of bypass is more likely.

FIG. 9 is a flow diagram showing example techniques 900 by which regression or correlation techniques may be applied to periodically-gathered data or occasionally-gathered data.

At block 902, a plurality of time-series of voltage-changes and current-changes may be obtained—either periodically, randomly or otherwise—over a plurality of time periods. In one example, multiple time-series, obtained at multiple different times, increase the likelihood that one time-series will be obtained while a bypass was operational and one time-series will be obtained while no bypass was operational.

At block 904, a statistically significant number of on/off events may be utilized to configure each time-series of voltage-changes and current-changes. Each on/off event may involve turning on or off an electrical load, such as an appliance, measured by a meter.

At block 906, the time-series of voltage-changes and current-changes may be based on intervals of less than 5, 10 or 15 minutes each. In some applications, use of a 5 minute interval may provide preferred results, although results may be based on design and use of the electrical grid and other factors.

At block 908, the plurality of time-series may be examined to determine whether there is consistency between correlations associated with each of the multiple time periods during which measurements were made at a meter. For example, less correlation of the $R^2$ values from different time-series may indicate changes of impedance that indicate bypass of the meter.

Figure 10:
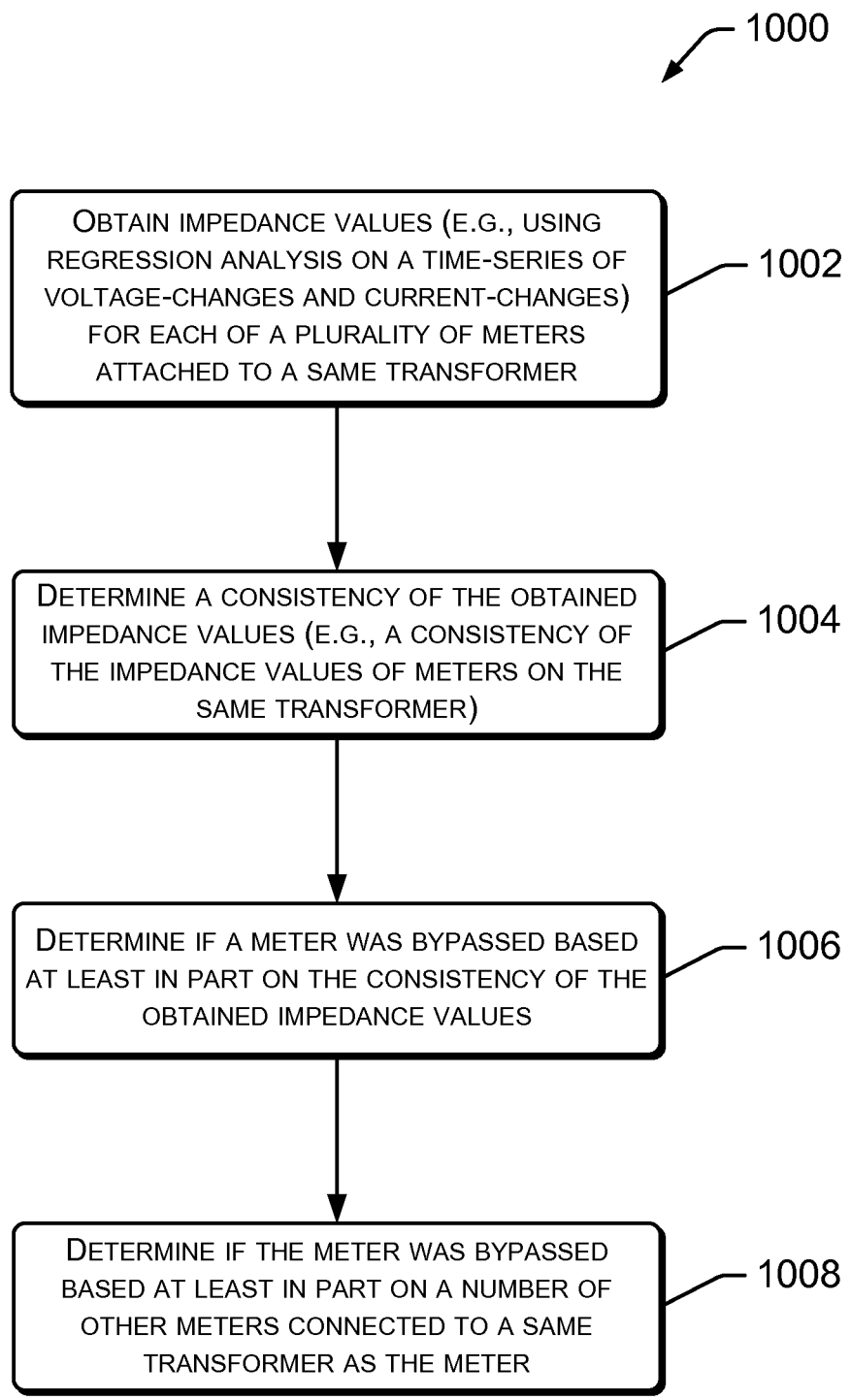
FIG. 10 is a flow diagram showing example techniques that may be applied to a plurality of meters attached to a same transformer.

FIG. 10 is a flow diagram showing example techniques 1000 by which regression analysis may be applied to time-series of voltage-changes and current-changes obtained at each of a plurality of meters attached to a same transformer. In one example, a meter in the plurality with an $R^2$ value that is significantly different from other meters may indicate a bypass at that meter. In another example, for a particular $R^2$ value—obtained by regression analysis on a time-series of voltage-changes and current-changes from each meter—a bypass is more likely if a smaller number of meters is attached to the transformer and a bypass is less likely if a larger number of meters is attached to the transformer. This is at least partly because effects of loads associated with meters adjacent to a particular meter may cause an $R^2$ value of the particular meter to be lower than would otherwise be the case.

At block 1002, impedance and $R^2$ values may be obtained for each of a plurality of meters attached to a same transformer. Impedance is shown by the slope of the regression line as seen in the examples of FIGS. 4, 5 and 6. $R^2$ may indicate goodness of fit, wherein a larger $R^2$ value is associated with data points that are more tightly clustered along the regression line.

At block 1004, a consistency or correlation of the impedance and $R^2$ values is determined.

At block 1006, based at least in part on the consistency of the obtained $R^2$ values, it may be determined if a meter was bypassed. Where all meters attached to the same transformer have similar $R^2$ values (that is, changes in current and changes in voltage correlate with similar goodness of fit), it is less likely that a bypass has been installed. However, when an $R^2$ value of a meter is inconsistent with other meters attached to the same transformer, it is more likely that the meter has been bypassed. In contrast, it would be normal for meters on a same transformer to have different impedances (slope of the regression line). Meters with longer connection wires will tend to have higher impedance than those closer to the meter.

At block 1008, in a further example, bypass of a meter may be determined based in part on a number of other meters connected to a same transformer. Where a larger number of meters are attached to the same transformer, a smaller $R^2$ value may be used as a threshold to indicate the presence of a bypass. Thus, a bypass may be indicated at least by factors including: the $R^2$ value of each meter's time-series of voltage-changes and current-changes; the correlation of the $R^2$ values of meters on a same transformer; and the total number of meters attached to a particular transformer.

Figure 11:
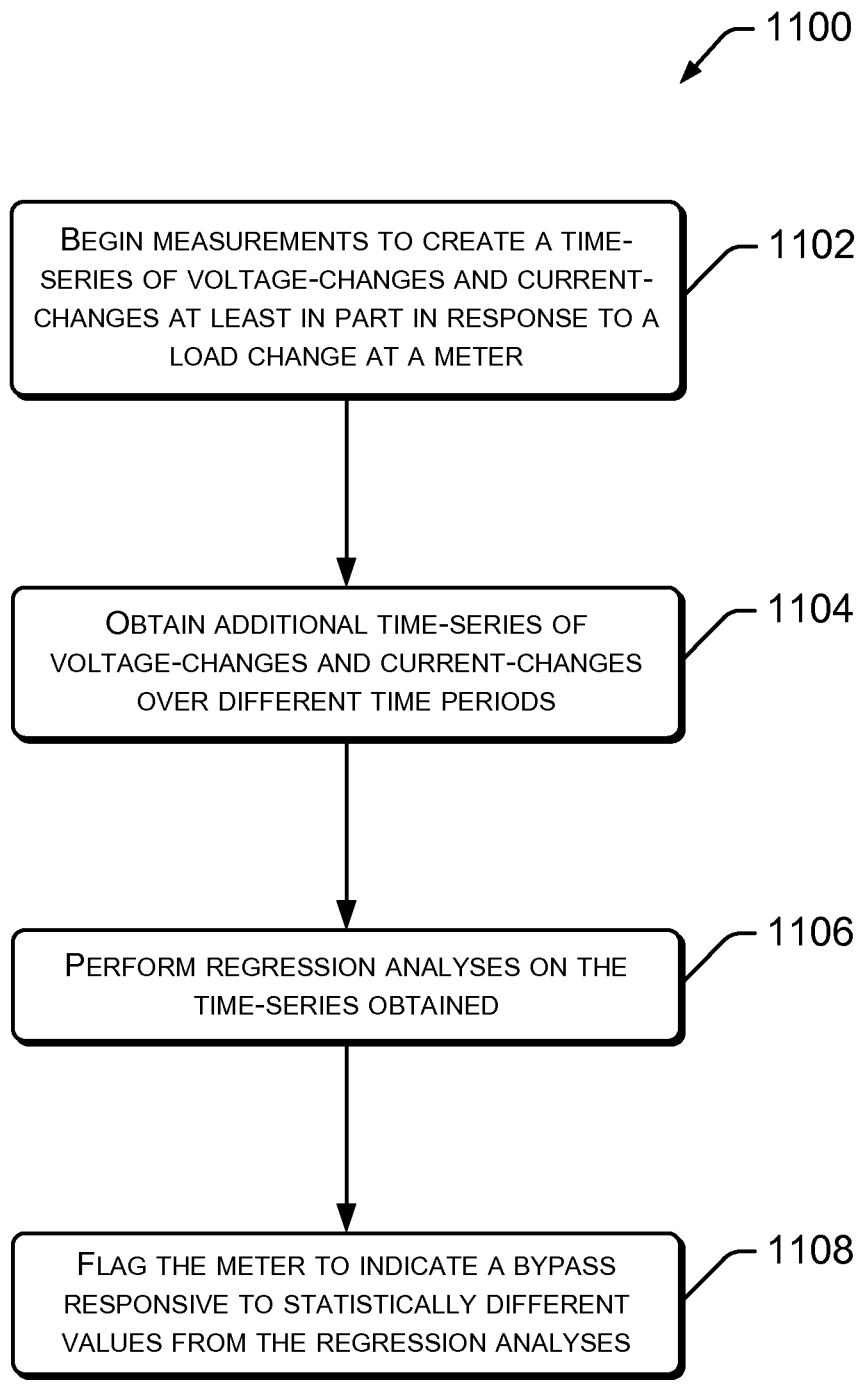
FIG. 11 is a flow diagram showing an example by which regression or correlation techniques may be applied to data gathered at different times.

FIG. 11 is a flow diagram showing example techniques 1100 by which regression or correlation techniques may be applied to data gathered at different times.

At block 1102, measurements to create a time-series of voltage-changes and current-changes may be initiated at least in part in response to a load change at a meter. A load change at the meter may be indicative of additional load changes in the near future, e.g., the customer may be at home, turning appliances on and off. The load changes may result in a time-series of voltage-changes and current-changes having enough data points to result in a meaningful regression analysis.

At block 1104, additional time-series of voltage-changes and current-changes are obtained over different time periods.

At block 1106, regression analysis may be performed on each time-series obtained. The result of the regression analyses may include a plurality of $R^2$ values, associated with each meter, which are similar. An $R^2$ value for a meter that is significantly below all others may indicate a bypass. Additionally, an impedance value of a particular meter that is inconsistent with other impedance values of the same meter measured at different times may indicate operation of a bypass.

At block 1108, a meter may be flagged or reported in response to an indication of a bypass.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
   obtaining time-stamped voltage and current measurement data measured by an electrical meter;
   obtaining a time-series of voltage-changes and current-changes based on the time-stamped voltage and current measurement data, wherein:
      the time-series of voltage-changes and current-changes are determined based on time-stamped voltage and current measurement data measured by the electrical meter;
      the time-series of voltage-changes and current-changes comprises a plurality of data points resulting from a plurality of load changes measured by the electrical meter; and
      the time-series of voltage-changes and current-changes comprises change-data indicating current changes and voltage changes resulting from appliances that are turned on or off;
   performing a regression analysis of the voltage-changes against the current-changes; and
   outputting an indication of whether the electrical meter was bypassed.

2. The method of claim 1, wherein a statistically significant number of on/off events involving electrical loads measured by the electrical meter comprise at least one appliance turned-on event and at least one appliance turned-off event.

3. The method of claim 1, wherein:
   the regression analysis indicates a degree of impedance correlation; and
   determining if the electrical meter was bypassed is based at least in part on the degree of impedance correlation.

4. The method of claim 1, wherein the time-series of voltage-changes and current-changes is based on intervals of 15 minutes or less.

5. The method of claim 1, additionally comprising:
   obtaining additional time-series of voltage-changes and current-changes over a period of days and at different times of day; and
   flagging the electrical meter as potentially bypassed responsive to calculated correlations that differ by a statistically significant amount.

6. The method of claim 1, wherein measurements to create the time-series of voltage-changes and current-changes begin at least in part in response to a load change at the electrical meter.

7. The method of claim 1, additionally comprising:
   obtaining an additional time-series of voltage-changes and current-changes over a different time period than was used to obtain the additional time-series of voltage-changes and current-changes;
   performing an additional regression analysis on the additional time-series of voltage-changes and current-changes; and
   flagging the electrical meter to indicate a bypass responsive to statistically different values between the regression analysis and the additional regression analysis.

8. The method of claim 1, wherein:
   the electrical meter performs ongoing regression analyses; and the electrical meter transmits at least one of an impedance value and a correlation value obtained from the regression analyses.

9. The method of claim 1, further comprising:
determining that a statistically significant number of on/off events were not seen within a threshold period of time;
determining that power was used during the threshold period of time; and
flagging the electrical meter as potentially bypassed in response to the determining that power was used during the threshold period of time.

10. The method of claim 1 further comprising:
obtaining a time-series of voltage-changes and current-changes periodically over multiple time periods; and
determining if there is consistency between correlations associated with each of the multiple time periods.

11. The method of claim 1, wherein determining whether the electrical meter was bypassed is additionally based on factors comprising:
an $R^2$ value of time-series of voltage-changes and current-changes of each meter connected to a transformer; and
a correlation of $R^2$ values of meters connected to the transformer.

12. A meter, comprising:
a processor;
a memory, in communication with the processor;
a metrology unit, in communication with the processor, to provide time-stamped voltage measurements and time-stamped current measurements over time;
a time-series generator, defined in the memory and executed by the processor, to generate a time-series of voltage-changes and current-changes based at least in part on the time-stamped voltage measurements and the time-stamped current measurements over time, wherein the time-series of voltage-changes and current-changes comprises a plurality of data points resulting from a plurality of load changes measured by the metrology unit, and wherein the time-series of voltage-changes and current-changes comprises change-data indicating current changes and voltage changes resulting from appliances that are turned on or off;
an analyzer, defined in the memory and executed by the processor, to perform an analysis on voltage-change data against current-change data, and to perform actions comprising:
performing a regression analysis of the time-series of voltage-changes and current-changes;
comparing output of the regression analysis to a regression analysis of at least one meter connected to a same transformer as the meter; and
outputting, based at least in part on the comparing, an indication of whether the meter was bypassed.

13. The meter as recited in claim 12, wherein the analyzer performs a regression analysis function.

14. The meter as recited in claim 12, wherein the analyzer performs a least squares regression of the voltage-change data against the current-change data of the time series of voltage-changes and current-changes.

15. The meter as recited in claim 12, wherein the time-series generator begins generation of the time-series of voltage-changes and current-changes in response to a load change measured by the metrology unit.

16. The meter as recited in claim 12, wherein a notification module transmits notification of an impedance calculation or the regression analysis consistent with a bypass of the meter.

17. The meter as recited in claim 12, wherein the time-series generator is programmed to determine whether a statistically significant number of on/off events indicate a valid correlation between voltage-changes and current-changes.

18. An electrical meter, comprising:
one or more processors;
a metrology unit in communication with the one or more processors;
memory, in communication with the one or more processors, the memory storing processor-executable instructions that, when executed by the one or more processors, cause the electrical meter to perform acts comprising:
measuring voltage and current at the metrology unit;
creating time-stamped voltage and current measurement data using data output from the metrology unit;
creating a time-series of voltage-changes and current-changes based on the time-stamped voltage and current measurement data measured by the metrology unit, wherein the time-series of voltage-changes and current-changes comprise a plurality of data points, and wherein the time-series of voltage-changes and current-changes comprises change-data indicating current changes and voltage changes resulting from appliances that are turned on or off;
performing a regression analysis of the time-series of voltage-changes and current-changes;
determining if the electrical meter was bypassed based at least in part on the regression analysis; and
outputting an indication of whether the electrical meter was bypassed.

19. The electrical meter of claim 1, wherein determining whether the electrical meter was bypassed is additionally based on factors comprising:
an $R^2$ value of the time-series of voltage-changes and current-changes of each meter connected to a transformer; and
a correlation of $R^2$ values of meters connected to the transformer.

* * * * *